United States Patent
Neiderman et al.

(10) Patent No.: US 11,872,600 B2
(45) Date of Patent: Jan. 16, 2024

(54) LANED BELT FOR CLEANER

(71) Applicant: Illinois Tool Works Inc., Glenview, IL (US)

(72) Inventors: John Neiderman, Camdenton, MO (US); Eric Wayne Becker, Phillipsburg, MO (US); Scotty Slavens, Lebanon, MO (US)

(73) Assignee: Illinois Tool Works Inc., Glenview, IL (US)

( * ) Notice: Subject to any disclaimer, the term of this patent is extended or adjusted under 35 U.S.C. 154(b) by 196 days.

(21) Appl. No.: 17/491,557

(22) Filed: Oct. 1, 2021

(65) Prior Publication Data

US 2023/0104821 A1 Apr. 6, 2023

(51) Int. Cl.
 *B65G 15/30* (2006.01)
 *B08B 3/04* (2006.01)
 (Continued)

(52) U.S. Cl.
 CPC .............. *B08B 3/041* (2013.01); *B08B 3/022* (2013.01); *B65G 15/58* (2013.01); *B65G 37/005* (2013.01); *H01L 24/75* (2013.01); *H05K 3/22* (2013.01); *H01L 2224/7501* (2013.01); *H01L 2224/75651* (2013.01)

(58) Field of Classification Search
 None
 See application file for complete search history.

(56) References Cited

U.S. PATENT DOCUMENTS

| 3,180,314 A | * | 4/1965 | Van Huis | ............. | A01K 31/165 |
|---|---|---|---|---|---|
| | | | | | 119/337 |
| 6,250,318 B1 | | 6/2001 | Kiat et al. | | |
| | | (Continued) | | | |

FOREIGN PATENT DOCUMENTS

| CN | 2431979 | * | 5/2001 |
|---|---|---|---|
| CN | 105127155 | * | 12/2015 |
| | (Continued) | | |

OTHER PUBLICATIONS

Translation of CN105127155 by Bai, dated Dec. 9, 2015.*

(Continued)

*Primary Examiner* — Mikhail Kornakov
*Assistant Examiner* — Ryan L Coleman
(74) *Attorney, Agent, or Firm* — Lando & Anastasi, LLP (57) ABSTRACT

A conveyor system is configured to transport the electronic substrates through cleaning modules of a cleaning apparatus. The conveyor system includes a first outer frame member, a second outer frame member, a bottom belt assembly disposed between the first outer frame member and the second outer frame member, and a top belt assembly spaced from the bottom belt assembly. The bottom belt assembly and the top belt assembly are configured to an electronic substrate therebetween to transport the electronic substrate along the conveyor system and through the at least one cleaning module. The bottom belt assembly or the top belt assembly includes a mesh material belt fabricated from heat resistant synthetic fibers. The conveyor system further includes a plurality of pins secured to the bottom belt assembly or the top belt assembly to create at least one lane along a length of the conveyor system.

15 Claims, 4 Drawing Sheets

(51) Int. Cl.
*B08B 3/02* (2006.01)
*B65G 15/58* (2006.01)
*B65G 37/00* (2006.01)
*H01L 23/00* (2006.01)
*H05K 3/22* (2006.01)

(56) References Cited

U.S. PATENT DOCUMENTS

2008/0268383 A1 10/2008 Matsuoka et al.
2014/0087633 A1* 3/2014 Read .................. B24C 3/083
 451/38
2015/0210476 A1* 7/2015 Ramsdell ............. B65G 17/065
 198/850

FOREIGN PATENT DOCUMENTS

CN 110628208 * 12/2019
JP 2020140611 * 9/2020

OTHER PUBLICATIONS

Translation of CN110628208 by Hua, dated Dec. 31, 2019.*
Translation of JP2020140611 by Wakushima, dated Sep. 3, 2020.*
Translation of CN2431979 by Li, published May 30, 2001.*
International Search Report and Written Opinion from International Application No. PCT/US2022/038745 dated Nov. 12, 2022.

* cited by examiner

LANED BELT FOR CLEANER

BACKGROUND OF THE DISCLOSURE

1. Field of the Disclosure

This application relates generally to an apparatus for cleaning electronic substrates, including printed circuit boards and semiconductor product assemblies, and, more particularly, to a belt having dedicated lanes to hold electronic substrates in place during a cleaning operation.

2. Discussion of Related Art

Various types of liquid cleaning apparatus are used to clean electronic substrates for removal of contaminates, such as flux residues, resins and the like. These contaminates remain on the electronic substrate from the soldering process.

The soldering process has recently advanced in two significant ways—the transition from tin-lead solder to lead-free materials and the reduction in the size of electronic substrate and the associated increase in the density of smaller, low-profile components. These new soldering materials have increased temperature requirements for soldering and are typically formulated to have higher flux content by weight. The combination of lead-free processes and new electronic substrate designs are demanding more time and energy to meet industry cleanliness standards.

Electronic substrates are transported within such cleaning machines by a conveyor, and must be adequately secured during the cleaning process. Stainless steel mesh material belts are used to transport electronic substrate through the cleaning machine. Delicate and sensitive components can be damaged by the stainless steel belt during a cleaning operation.

SUMMARY OF THE DISCLOSURE

One aspect of the present disclosure is directed to a cleaning apparatus for cleaning electronic substrates including printed circuit boards and semiconductor product assemblies. In one embodiment, the cleaning apparatus comprises at least one cleaning module configured to treat electronic substrates and a conveyor system configured to transport the electronic substrates through the at least one cleaning module. The conveyor system includes a first outer frame member, a second outer frame member spaced from the first outer frame member, a bottom belt assembly disposed between the first outer frame member and the second outer frame member, and a top belt assembly spaced from the bottom belt assembly. The bottom belt assembly and the top belt assembly are configured to an electronic substrate therebetween to transport the electronic substrate along the conveyor system and through the at least one cleaning module. One of the bottom belt assembly and the top belt assembly includes a mesh material belt fabricated from heat resistant synthetic fibers.

Embodiments of the cleaning apparatus further may include attaching the mesh material belt of the one of the bottom belt assembly and the top belt assembly to a respective one of a bottom conveyor belt and a top conveyor belt by a plurality of clips provided along edges of the mesh material belt. The mesh material belt may be attached to the top conveyor belt of the top belt assembly. The conveyor assembly further may include a plurality of pins secured to one of the bottom belt assembly and the top belt assembly. The plurality of pins may be configured on the one of the bottom belt assembly and the top belt assembly to create at least one lane along a length of the conveyor system. The plurality of pins may be secured to the bottom belt assembly. The plurality of pins may be secured to the bottom belt assembly to create two lanes along the length of the conveyor system. The plurality of pins may be secured to the bottom belt assembly to create three lanes along the length of the conveyor system. Each pin may include a pin base and a pin cap releasably secured to the pin base. Each pin base may include a base portion and a pin portion configured to extend through the one of the bottom belt assembly and the top belt assembly, the pin cap being releasably secured to hold the pin in place.

Another embodiment of the present disclosure is directed to a cleaning apparatus for cleaning electronic substrates including printed circuit boards and semiconductor product assemblies. In one embodiment, the cleaning apparatus comprises at least one cleaning module configured to treat electronic substrates and a conveyor system configured to transport the electronic substrates through the at least one cleaning module. The conveyor system includes a first outer frame member, a second outer frame member spaced from the first outer frame member, a bottom belt assembly disposed between the first outer frame member and the second outer frame member, and a top belt assembly spaced from the bottom belt assembly. The bottom belt assembly and the top belt assembly are configured to an electronic substrate therebetween to transport the electronic substrate along the conveyor system and through the at least one cleaning module. The conveyor system further includes a plurality of pins secured to one of the bottom belt assembly and the top belt assembly, the plurality of pins being configured on the one of the bottom belt assembly and the top belt assembly to create at least one lane along a length of the conveyor system.

Embodiments of the cleaning apparatus further may include securing the plurality of pins to the bottom belt assembly. The plurality of pins may be secured to the bottom belt assembly to create two lanes along the length of the conveyor system. The plurality of pins may be secured to the bottom belt assembly to create three lanes along the length of the conveyor system. One of the bottom belt assembly and the top belt assembly includes a mesh material belt fabricated from heat resistant synthetic fibers. The mesh material belt of one of the bottom belt assembly and the top belt assembly is attached to a respective one of a bottom conveyor belt and a top conveyor belt by a plurality of clips provided along edges of the mesh material belt. Each pin may include a pin base and a pin cap releasably secured to the pin base. Each pin base may include a base portion and a pin portion configured to extend through the one of the bottom belt assembly and the top belt assembly. The pin cap being releasably secured to hold the pin in place.

A method for cleaning electronic substrates with the cleaning apparatus comprises: loading electronic substrates in a carrier device; transporting the carrier device by the conveyor system through the at least one cleaning module; and performing a cleaning operation.

Yet another aspect of the present disclosure is directed to a conveyor system configured to transport the electronic substrates through the at least one cleaning module of a cleaning apparatus. In one embodiment, the conveyor system comprises a first outer frame member, a second outer frame member spaced from the first outer frame member, a bottom belt assembly disposed between the first outer frame member and the second outer frame member, and a top belt assembly spaced from the bottom belt assembly. The bottom belt assembly and the top belt assembly are configured to an electronic substrate therebetween to transport the electronic substrate along the conveyor system and through the at least one cleaning module. One of the bottom belt assembly and the top belt assembly includes a mesh material belt fabricated from heat resistant synthetic fibers.

Embodiments of the conveyor system further may include attaching the mesh material belt of the one of the bottom belt assembly and the top belt assembly to a respective one of a bottom conveyor belt and a top conveyor belt by a plurality of clips provided along edges of the mesh material belt. The mesh material belt may be attached to the top conveyor belt of the top belt assembly. The conveyor assembly further may include a plurality of pins secured to one of the bottom belt assembly and the top belt assembly. The plurality of pins may be configured on the one of the bottom belt assembly and the top belt assembly to create at least one lane along a length of the conveyor system. The plurality of pins may be secured to the bottom belt assembly. The plurality of pins may be secured to the bottom belt assembly to create two lanes along the length of the conveyor system. The plurality of pins may be secured to the bottom belt assembly to create three lanes along the length of the conveyor system. Each pin may include a pin base and a pin cap releasably secured to the pin base. Each pin base may include a base portion and a pin portion configured to extend through the one of the bottom belt assembly and the top belt assembly, the pin cap being releasably secured to hold the pin in place.

Another aspect of the present disclosure is directed to a conveyor system configured to transport the electronic substrates through the at least one cleaning module of a cleaning apparatus. In one embodiment, the conveyor system comprises a first outer frame member, a second outer frame member spaced from the first outer frame member, a bottom belt assembly disposed between the first outer frame member and the second outer frame member, and a top belt assembly spaced from the bottom belt assembly. The bottom belt assembly and the top belt assembly are configured to an electronic substrate therebetween to transport the electronic substrate along the conveyor system and through the at least one cleaning module. The conveyor system further comprises a plurality of pins secured to one of the bottom belt assembly and the top belt assembly. The plurality of pins are configured on the one of the bottom belt assembly and the top belt assembly to create at least one lane along a length of the conveyor system.

Embodiments of the conveyor system further may include securing the plurality of pins to the bottom belt assembly. The plurality of pins may be secured to the bottom belt assembly to create two lanes along the length of the conveyor system. The plurality of pins may be secured to the bottom belt assembly to create three lanes along the length of the conveyor system. One of the bottom belt assembly and the top belt assembly may include a mesh material belt fabricated from heat resistant synthetic fibers. The mesh material belt of one of the bottom belt assembly and the top belt assembly may be attached to a respective one of a bottom conveyor belt and a top conveyor belt by a plurality of clips provided along edges of the mesh material belt. Each pin may include a pin base and a pin cap releasably secured to the pin base. Each pin base may include a base portion and a pin portion configured to extend through the one of the bottom belt assembly and the top belt assembly, with the pin cap being releasably secured to the pin portion to hold the pin in place.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Solder paste is routinely used in the assembly of electronic substrates, including printed circuit boards and semiconductor product assemblies, where the solder paste is used to join electronic components to the substrate. Solder paste includes solder for joint formation and flux for preparing metal surfaces for solder attachment. The solder paste may be deposited onto the metal surfaces (e.g., electronic pads) provided on the electronic substrate by using any number of application methods. In one example, a stencil printer may employ a squeegee to force the solder paste through a metallic stencil laid over an exposed surface of the electronic substrate. In another example, a dispenser may dispense solder paste material onto specific areas of the electronic substrate. Leads of an electronic component are aligned with and impressed into the solder deposits to form the assembly. In reflow soldering processes, the solder is then heated to a temperature sufficient to melt the solder and cooled to permanently couple the electronic component, both electrically and mechanically, to the electronic substrate. The solder typically includes an alloy having a melting temperature lower than that of the metal surfaces to be joined. The temperature also must be sufficiently low so as to not cause damage to the electronic component. In certain embodiments, the solder may be a tin-lead alloy. However, solders employing lead-free materials may also be used. Another process to attach components onto electronic substrates is a wave soldering process.

In the solder, the flux typically includes a vehicle, solvent, activators and other additives. The vehicle is a solid or nonvolatile liquid that coats the surface to be soldered and can include rosin, resins, glycols, polyglycols, polyglycol surfactants, and glycerine. The solvent, which evaporates during the pre-heat and soldering process, serves to dissolve the vehicle activators, and other additives. Examples of typical solvents include alcohols, glycols, glycol esters and/or glycol ethers and water. The activator enhances the removal of metal oxide from the surfaces to be soldered. Common activators include amine hydrochorides, dicarboxylic acids, such as adipic or succinic acid, and organic acids, such as citric, malic or abietic acid. Other flux additives can include surfactants, viscosity modifiers and additives for providing low slump or good tack characteristics for holding the components in place before reflow.

As mentioned above, the soldering processes described herein demand that the electronic substrate be cleaned prior to being released for use. Disclosed herein is an inline cleaning process to remove undesired contaminations from manufacturing processes. In one embodiment, a conveyor system is configured to transport products through a cleaning machine. An active top conveyor belt is combined with the normal conveyor transportation system to provide proper retention of electronic substrates or substrate containers during the cleaning process. The active top conveyor belt can properly retain substrates, e.g., semiconductor products, in singular form or in tray form, e.g., Jedec tray form. The proper retention eliminates movement or disruption during the cleaning process. The conveyor system can be configured to provide one or more lanes, each providing support and retention to electronic substrates arranged in a linear fashion along the conveyor system.

It is to be appreciated that embodiments of the systems and apparatuses discussed herein are not limited in application to the details of construction and the arrangement of components set forth in the following description or illustrated in the accompanying drawings. The systems and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
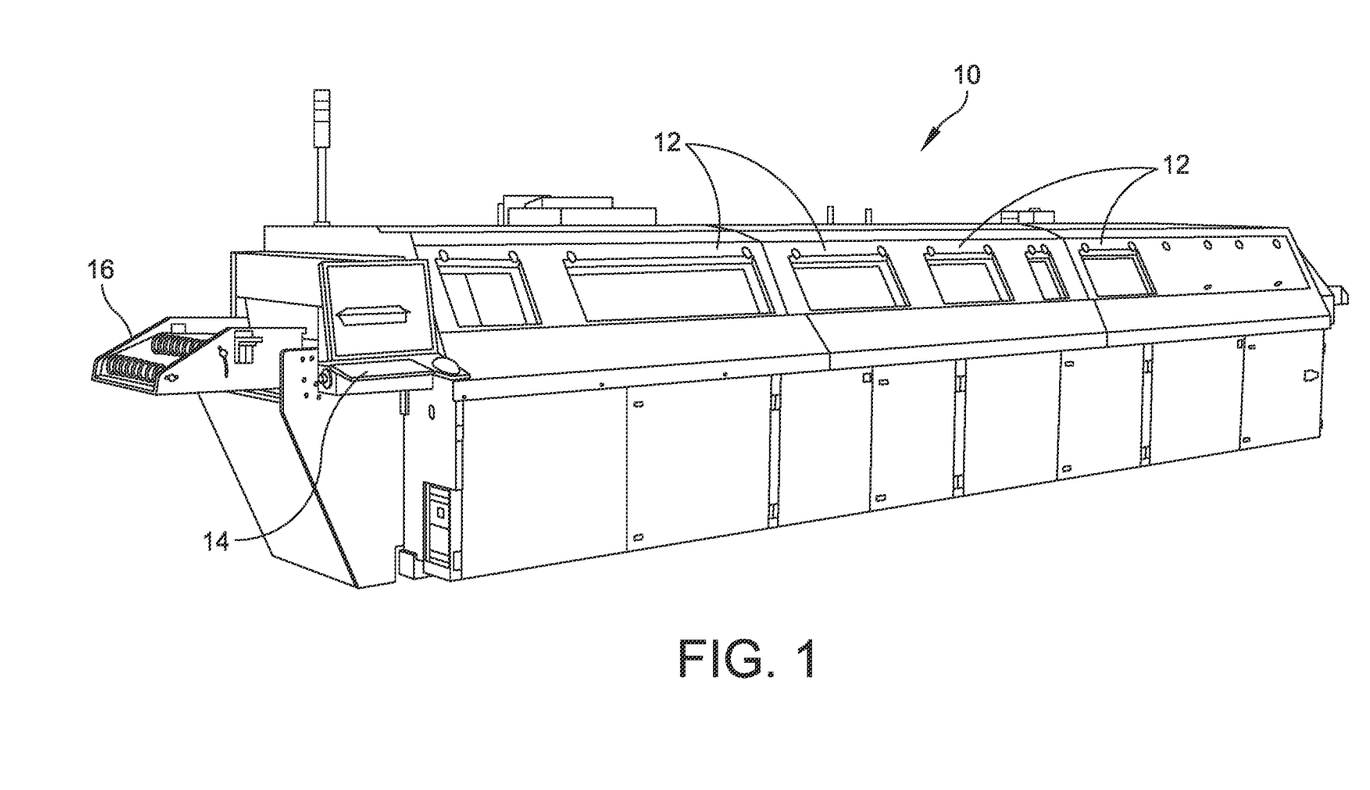
FIG. 1 is a perspective view of an electronic substrate cleaning apparatus.

Referring now to the drawings, and more particularly to FIG. 1, an electronic substrate cleaning apparatus is generally indicated at 10. As shown, the cleaning apparatus 10 is an elongate structure that includes several modules, each indicated at 12, to clean and process electronic substrates. In one exemplary embodiment, the cleaning apparatus 10 includes, one or more of the following modules: a pre-wash module, a wash module, a pre-rinse module, a rinse module, and a dry module. A control module having a user interface together indicated at 14 provides an operator the ability to program and monitor the cleaning apparatus 10.

The cleaning apparatus 10 further includes an elongate conveyor 16 that is configured to transport electronic substrates through the modules 12 of the cleaning apparatus. The conveyor 16 is designed to securely hold electronic substrates during the sometimes rigorous cleaning processes. Embodiments of the present disclosure are directed to improvements in the conveyor 16 and the ability to secure electronic substrates during the cleaning process.

Figure 2:
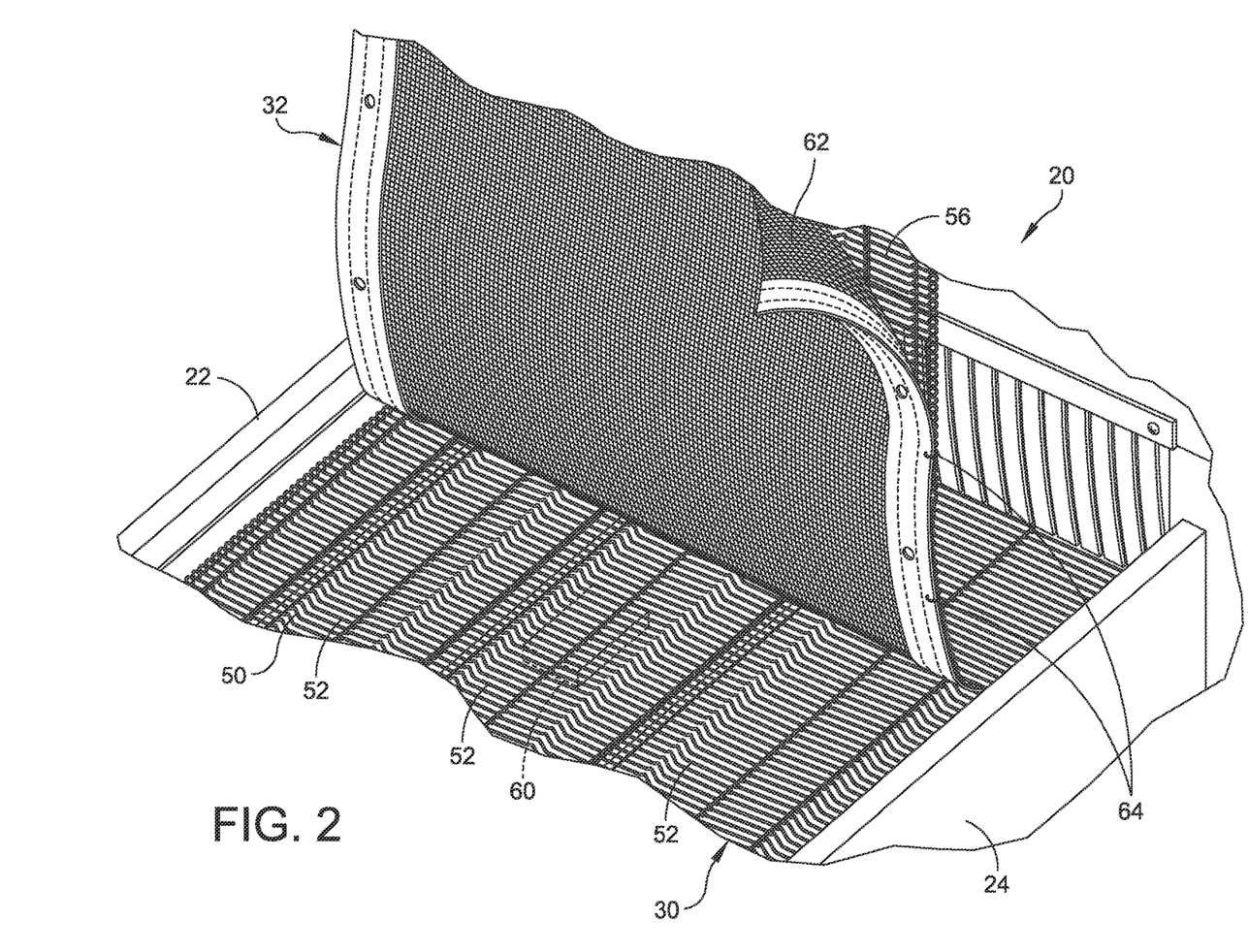
FIG. 2 is a perspective view of a portion of a belt conveyor used to transport electronic substrates through the cleaning apparatus.

Referring to FIG. 2, a portion of a hold down conveyor system of an embodiment of the present disclosure is generally indicated at 20. As shown, the conveyor system 20 includes a first outer frame member 22 and a second outer frame member 24 that are spaced apart and suitably secured within a frame structure provided in the cleaning apparatus. The conveyor system 20 further includes a bottom belt assembly, generally indicated at 30, including one or more belts and a top belt assembly, generally indicated at 32, including one or more belts that is spaced from the bottom belt assembly. The bottom belt assembly 30 and the top belt assembly 32 are configured to receive an electronic substrate and/or a product carrier therebetween to transport electronic substrates through the modules 12 of the cleaning apparatus 10. As shown, the belt assemblies 30, 32 are disposed between the first outer frame member 22 and the second outer frame member 24 and suitably coupled to the frame members to drive their respective rotations. In one embodiment, a belt drive system can be employed to power the rotations of at least one of the bottom belt assembly 30 and the top belt assembly 32. It should be understood that the rotation of the bottom belt assembly 30, the top belt assembly 32, or both, may be achieved by any type of drive system known in the art.

As described above, the top belt assembly 32 is spaced from the bottom belt assembly 30. In one embodiment, the bottom belt assembly 30 includes a stainless steel wire belt 50 that can be configured with lanes, each indicated at 52. The lanes 52 are formed by forming bends in wires used to create the bottom wire belt 50. Although shown with lanes 52, the bottom wire belt 50 can be configured flat with no lanes. Further the bottom wire belt 50 can be configured with any number of lanes. For example, the bottom wire belt 50 can be configured with two, three or four or more lanes. The bottom wire belt 50 is driven by a belt drive system, such as the drive system described above.

Similarly, the top belt assembly 32 includes a stainless steel wire belt 56 that is relatively flat across a width of the wire belt. Although not preferred, the top wire belt 56 can be configured with one or more lanes that mate with the lanes 52 defined by the bottom wire belt 50. It should be understood that both the bottom wire belt 50 and the top wire belt 56 can be configured without lanes and lie relatively flat along a width of the respective wire belt. The top wire belt 56 is driven by a belt drive system, such as the drive system described above.

As shown, the top belt assembly 32 is configured to mate with the bottom belt assembly 30 so as to provide a space in which electronic substrates and/or carriers, indicated at 60, can be loaded on the bottom belt assembly without interference from the top belt assembly. The top belt assembly 32 further includes a top mesh material belt 62 fabricated from heat resistant synthetic fibers. In one embodiment, the top mesh material belt 62 is fabricated from KEVLAR® material, which is offered by DuPont de Nemours, Inc. In a certain embodiment, the heat resistant synthetic fibers of the top mesh material belt 62 are coated with a polymer material, such as polytetrafluoroethylene ("PTFE"). The provision of the top mesh material belt 62 is to protect the electronic substrate or carrier or item to be cleaned while being processed through the cleaning apparatus 10. The top wire belt 56, without the top mesh material belt 62, can cause damage to the electronic substrate or item given the hardness of the stainless steel. The top mesh material belt 62 engages the electronic substrate or item without damaging the electronic substrate or item during processing. It should be understood that the bottom wire belt 50 of the bottom belt assembly 30 can be provided with a bottom mesh material belt that mates with the top mesh material belt of the top belt assembly.

As shown in FIG. 2, the top mesh material belt 62 of the top belt assembly 32 is attached to the top wire belt 56 by a plurality of clips, each indicated at 64, which are provided along edges of the top mesh material belt. As shown, the clips 64 are spaced evenly along the mating edges of the top mesh material belt 62 and the top wire belt 56 to secure the top mesh material belt to the top wire belt. In one embodiment, the clips 64 are evenly spaced four to eight inches apart, with a desired spacing of six inches apart. However, any suitable number of clips 64 may be provided, spaced apart from one another desired distances. The clips 64 not only secure the top mesh material belt 62 to the top wire belt 56, but further provide structural support of the top belt assembly 32 along a width of the top belt assembly. In other words, the clips 64 provide structural integrity of the top belt assembly 32 to keep the top belt assembly tight across the width of the top belt assembly. In one embodiment, the clips 64 are fabricated from stainless steel. However, the clips 64 can be fabricated from any suitable material that provides structural strength and heat resistance.

In some embodiments, as mentioned above, a bottom mesh material belt can be provided as part of the bottom belt assembly 30 and secured to the bottom wire belt 50 by clips, such as clips 64, as well.

Figure 3:
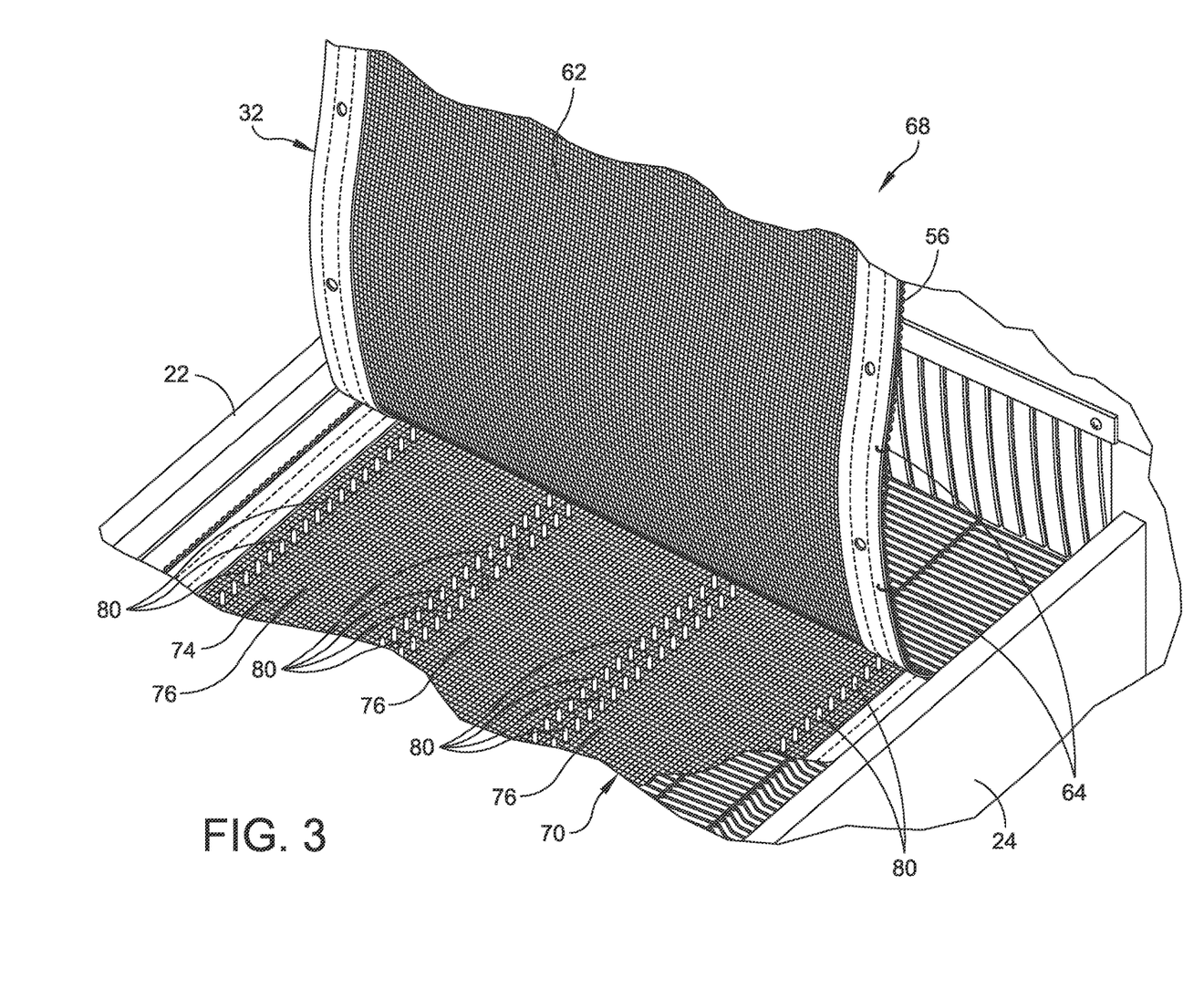
FIG. 3 is a perspective view of a portion of the belt conveyor of another embodiment of the present disclosure.

Referring to FIG. 3, a conveyor system of another embodiment is generally indicated at 68. As shown, the conveyor system 68 includes a bottom belt assembly, generally indicated at 70, is configured with a relatively flat bottom wire belt 72. Stated another way, the bottom wire belt 72 does not include the lanes 52 of the bottom wire belt 50 of the bottom belt assembly 30 shown in FIG. 2. To create lanes provided by the bottom wire belt 72 of the bottom belt assembly 70, the bottom belt assembly includes a bottom mesh material belt 74 that is secured to the bottom wire belt and a plurality of pins, each indicated at 80, which are secured to the bottom mesh material belt that create the lanes, each indicated at 76. As shown, the pins 80 are secured to the bottom mesh material belt 74 of the bottom belt assembly 70 to create the several lanes 76 along a length of the conveyor system. The spacing of pins 80 along a length of the bottom mesh material belt 74 can be relatively close to one another, e.g., one inch apart, while the spacing of pins along a width of each lane 76 can vary to accommodate the width of the electronic substrate or carrier 60 shown in FIG. 2.

Thus, although three lanes 76 are shown in FIG. 3, the pins 80 can be provided in any desired scheme to create a desired number of lanes having desired widths. The manner in which the pins 80 are spaced along the length and the width of the bottom mesh material belt 74 can be varied to accommodate a particular need. Further, the space between the bottom belt assembly 70 and the top belt assembly 32 may be varied in the traditional manner.

Figure 4:
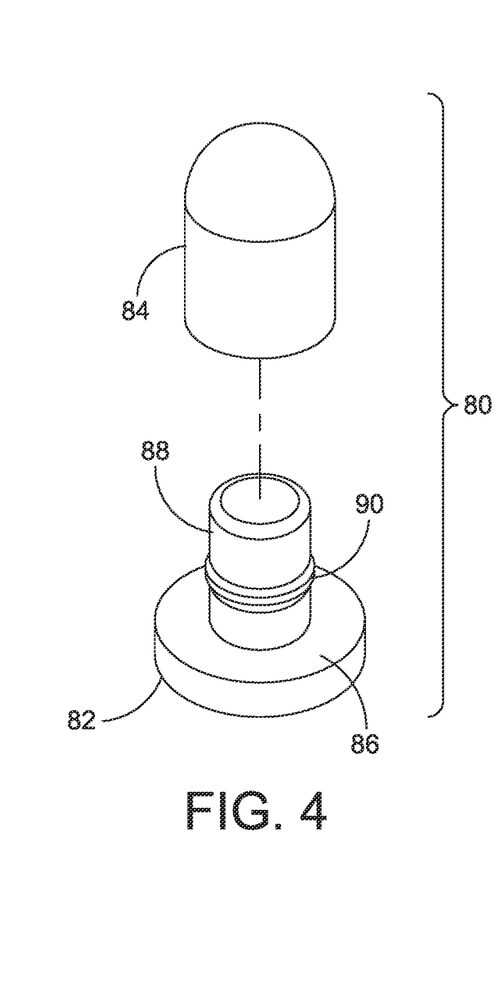
FIG. 4 is an exploded perspective view of a pin of the belt conveyor.
Figure 5:
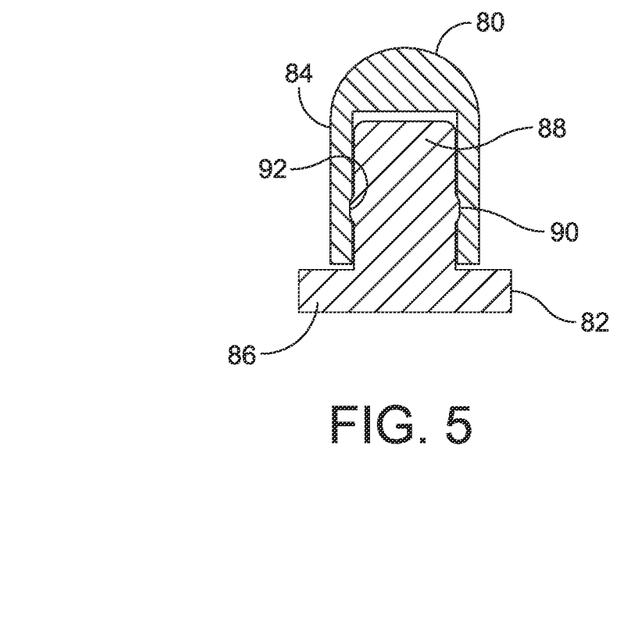
FIG. 5 is a cross-sectional view of the pin shown in FIG. 4.

Referring to FIGS. 4 and 5, the construction of the pin 80 is illustrated. As shown, in one embodiment, the pin 80 is of two-part construction having a pin base 82 and a pin cap 84, which is releasably secured to the pin base. In one embodiment, the pin base 82 includes a base portion 86 and a pin portion 88 configured to extend through the bottom mesh material belt 74 of the bottom belt assembly 70. The pin cap 84 is releasably secured to the pin portion 88 to hold the pin 80 in place on the bottom mesh material belt 74. In one example, the pin base 82 and the pin cap 84 are configured to be secured to one another with a snap fit construction. As best shown in FIG. 5, the pin portion 88 of the pin base 82 includes an outwardly protruding annular rim 90 that is received within a corresponding annular recess 92 formed within a cavity of the pin cap 84. The diameter of the pin portion 88 of the pin base 82 is sized so that the pin portion extends through an opening of the bottom mesh material belt 74. Once the pin cap 84 is secured to the pin portion 88 of the pin base 82, the edge of the pin cap and base portion 86 of the pin base secure the bottom mesh material belt 74 in place to hold the pin 80 securely in place. The diameter of the pin portion can be sized to fit within the openings within the mesh material belt.

In some embodiments, the pins can be fabricated from a suitable polymer, such as nylon or polyether ether ketone (peek). Other suitable materials that are heat resistant (up to 300° F.) and gentle on the components contained between the bottom belt assembly and the top belt assembly may be provided.

In some embodiments, a method for cleaning electronic substrates with the cleaning apparatus is further provided. In one embodiment, the method of cleaning includes loading electronic substrates in a carrier device, transporting the carrier device by the conveyor system through the at least one cleaning module, and performing a cleaning operation. In a certain embodiment, the cleaning operation is controlled by the control module 14 of the cleaning apparatus 10.

It is to be understood that the above description is intended by way of illustration and example only and is not intended to be taken by way of limitation, and that changes and modifications are possible. For example, the cleaning apparatus 10 described above may be any type of cleaning machine that is used to clean electronic substrates. Accordingly, other embodiments are contemplated, and modifications and changes could be made without departing from the scope of this application.

In one embodiment, the control module 14 of the cleaning apparatus 10 is configured with an operating system, e.g., a Windows®-based operating system, that provides familiar pull-down menus and has data-logging and barcode capability. The operating system is easily networked for downloading of recipes and remote access to operating data. The user interface enables quick and easy viewing of system pressures, water levels, pump and blower operation, temperature, and fill/drain operation.

In one embodiment, the cleaning apparatus 10 is configured with functional modules 12 that are designed to accomplish different tasks in removing contamination. Some modules maximize flooding, while others maximize impact force for cleaning tight spaces. The cleaning apparatus 10 uses proprietary pump and nozzle technology throughout the system to optimize performance.

In one embodiment, the cleaning apparatus 10 may be configured to have appropriately sized modules and strategic manifold placement increase throughput while ensuring thorough removal of contaminants. The cleaning apparatus 10 may include perforated rails, curtain containment, and a cabinet designed to manage wash solution within the system for maximum conservation of costly chemistries. The cleaning apparatus 10 further may include a wet chemical isolation module that is powered by the recirculating rinse pump to ensure optimal pre-rinsing and to facilitate closed-loop recycling of the rinse section. An exhaust may be separated between the wash and rinse modules to minimize chemical migration through the system.

The cleaning apparatus 10 enables efficient and complete drying during a cleaning process. The cleaning apparatus 10 is configured to increase throughput, providing cost savings and return on investment.

The importance of cleaning electronic assemblies increases dramatically with lead-free soldering. Higher temperatures are required in lead-free soldering, and wetting is much more difficult. To improve "wettability," flux compositions may require higher activation. High-solid flux formulations commonly leave more undesirable residue and require cleaning.

A successful cleaning system must be able to handle the harsh demands of the lead-free process. The cleaning apparatus 10 disclosed herein may be configured with unique cleaning nozzles that provide unmatched impact force to penetrate under and around components and clean even the most challenging flux residues.

Many process parameters may be configured in a computer-controlled operator interface provided in the cleaning apparatus 10. System pressure, water levels, and temperatures are easily accessed. Data logging and barcode capability are features that enhance and streamline the production process.

In some embodiments, the cleaning apparatus 10 may be configured to include nozzles, including "jet" nozzles, to apply a maximum direct dynamic impingement to the product surface and effectively clean under low stand-off components for difficult cleaning applications. The nozzles can be configured to produce large water droplets to enhance the cleaning performance of the cleaning apparatus 10 when operating at a lower rate of pressure. The nozzles can be configured to produce an oscillating action to better clean and flush flux residues in a prewash to reduce foaming in the recirculating wash.

In some embodiments, the cleaning apparatus 10 can be equipped with orbitally welded, stainless steel plumbing to eliminate pressure drops and leaks, all sections can be replaced or upgraded in minutes to maximize uptime and process flexibility. Plumbing sections have quick-disconnect fittings for ease of maintenance.

In some embodiments, the cleaning apparatus 10 can be configured with an optional chemical isolation (CI) module, which is a multi-section module that efficiently removes chemistry from the product prior to the rinse section. The majority of the chemistry is removed in a first section, which is close-looped back into the wash tank reservoir.

In some embodiments, the cleaning apparatus 10 can be configured to include one or more drying modules, which are integrated into a cabinet of the cleaning apparatus. Typical performance includes drying complex assemblies to within 0.1 gram of prewashed dry weight. The module reduces exhaust requirements by 44% and uses 15% less power when compared with conventional drying systems, providing a rapid return on investment.

In some embodiments, the cleaning apparatus 10 can include one or more rear panels, which can be easily removed for maintenance with the added benefit of single door removal to access the wash and rinse tanks. Front doors further can be provided to provide quick access to electrical panels, computer, heaters, floats and thermocouples. The cleaning apparatus 10 can include hinged, tempered glass windows to provide optimum viewing and access.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A cleaning apparatus for cleaning electronic substrates including printed circuit boards and semiconductor product assemblies, the cleaning apparatus comprising:
    at least one cleaning module configured to treat electronic substrates; and
    a conveying system configured to transport the electronic substrates through the at least one cleaning module, the conveyor system including:
        a first outer frame member,
        a second outer frame member spaced from the first outer frame member,
        a bottom belt assembly disposed between the first outer frame member and the second outer frame member, and
        a top belt assembly spaced from the bottom belt assembly, the bottom belt assembly and the top belt assembly being configured to receive an electronic substrate therebetween to transport the electronic substrate along the conveyor system and through the at least one cleaning module; and
        a plurality of pins secured to one of the bottom belt assembly and the top belt assembly, the plurality of pins being configured on the one of the bottom belt assembly and the top belt assembly to create at least one lane along a length of the conveyor system,
        wherein each pin includes a pin base and a pin cap releasably secured to the pin base, and
        wherein each pin base includes a base portion and a pin portion configured to extend through a belt of the one of the bottom belt assembly and the top belt assembly.

2. The cleaning apparatus of claim 1, wherein a mesh material belt of the one of the bottom belt assembly and the top belt assembly is attached to a respective one of a bottom conveyor belt of the top belt assembly and a top conveyor belt of the top belt assembly by a plurality of clips provided along edges of the mesh material belt.

3. The cleaning apparatus of claim 2, wherein the mesh material belt is attached to the top conveyor belt of the top belt assembly.

4. The cleaning apparatus of claim 1, wherein the plurality of pins is secured to the bottom belt assembly.

5. The cleaning apparatus of claim 4, wherein the plurality of pins is secured to the bottom belt assembly to create two lanes along the length of the conveyor system.

6. The cleaning apparatus of claim 1, wherein the plurality of pins is secured to the bottom belt assembly to create three lanes along the length of the conveyor system.

7. A method for cleaning electronic substrates with the cleaning apparatus of claim 1, the method comprising:
    loading electronic substrates in a carrier device;
    transporting the carrier device by the conveyor system through the at least one cleaning module; and
    performing a cleaning operation.

8. The cleaning apparatus of claim 1, wherein the one of the bottom belt assembly and the top belt assembly includes a mesh material belt fabricated from heat resistant synthetic fibers.

9. A cleaning apparatus for cleaning electronic substrates including printed circuit boards and semiconductor product assemblies, the cleaning apparatus comprising:
    at least one cleaning module configured to treat electronic substrates; and
    a conveyor system configured to transport the electronic substrates through the at least one cleaning module, the conveyor system including:
        a first outer frame member,
        a second outer frame member spaced from the first outer frame member,
        a bottom belt assembly disposed between the first outer frame member and the second outer frame member, a top belt assembly spaced from the bottom belt assembly, the bottom belt assembly and the top belt assembly being configured to receive an electronic substrate therebetween to transport the electronic substrate along the conveyor system and through the at least one cleaning module, and a plurality of pins secured to one of the bottom belt assembly and the top belt assembly, the plurality of pins being configured on the one of the bottom belt assembly and the top belt assembly to create at least one lane along a length of the conveyor system, wherein each pin includes a pin base and a pin cap releasably secured to the pin base, and wherein each pin base includes a base portion and a pin portion configured to extend through a belt of the one of the bottom belt assembly and the top belt assembly, wherein the plurality of pins functions to secure said belt to the one of the bottom belt assembly and the top belt assembly.

10. The cleaning apparatus of claim 9, wherein the plurality of pins is secured to the bottom belt assembly.

11. The cleaning apparatus of claim 10, wherein the plurality of pins is secured to the bottom belt assembly to create two lanes along the length of the conveyor system.

12. The cleaning apparatus of claim 10, wherein the plurality of pins is secured to the bottom belt assembly to create three lanes along the length of the conveyor system.

13. The cleaning apparatus of claim 9, wherein one of the bottom belt assembly and the top belt assembly includes a mesh material belt fabricated from heat resistant synthetic fibers.

14. The cleaning apparatus of claim 13, wherein the mesh material belt of one of the bottom belt assembly and the top belt assembly is attached to a respective one of a bottom conveyor belt of the bottom belt assembly and a top conveyor belt of the top belt assembly by a plurality of clips provided along edges of the mesh material belt.

15. A Method for cleaning electronic substrates with the cleaning apparatus of claim 9, the method comprising:
loading electronic substrates in a carrier device;
transporting the carrier device by the conveyor system through the at least one cleaning module; and
performing a cleaning operation.

* * * * *